United States Patent
Kajino

(10) Patent No.: US 12,237,781 B2
(45) Date of Patent: Feb. 25, 2025

(54) ULTRASONIC MOTOR, ROBOT, AND LIFE DIAGNOSTIC METHOD OF ULTRASONIC MOTOR

(71) Applicant: SEIKO EPSON CORPORATION, Tokyo (JP)

(72) Inventor: Kiichi Kajino, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 308 days.

(21) Appl. No.: 18/081,713

(22) Filed: Dec. 15, 2022

(65) Prior Publication Data

US 2023/0198426 A1 Jun. 22, 2023

(30) Foreign Application Priority Data

Dec. 16, 2021 (JP) ................. 2021-204006

(51) Int. Cl.
*H02N 2/00* (2006.01)
*G01R 31/34* (2020.01)

(52) U.S. Cl.
CPC .......... *H02N 2/008* (2013.01); *G01R 31/343* (2013.01); *H02N 2/0025* (2013.01); *H02N 2/0065* (2013.01)

(58) Field of Classification Search
CPC .... H02N 2/008; H02N 2/0025; H02N 2/0065; H02N 2/062; H02N 2/0075; H02N 2/004; H02N 2/026; G01R 31/343; G01R 31/00
See application file for complete search history.

(56) References Cited

U.S. PATENT DOCUMENTS 11,205,975 B2 * 12/2021 Saito .................. B25J 9/126
2014/0312738 A1 10/2014 Suzuki et al.

FOREIGN PATENT DOCUMENTS

JP 2013102644 A 5/2013

* cited by examiner

*Primary Examiner* — Emily P Pham
(74) *Attorney, Agent, or Firm* — Hui Sun

(57) ABSTRACT

An ultrasonic motor includes a vibration section having a piezoelectric element configured to generate vibration by receiving a drive voltage, a driven section, a convex section connected to the vibration section and configured to transmit vibration of the vibration section to the driven section, a drive circuit configured to generate the drive voltage, an encoder configured to detect a movement amount of the driven section, a storage section configured to store a specified voltage value, and a determination section configured to receive position information from the encoder when the driven section starts to move and a voltage value at the time of start up from the drive circuit and to determine that least one of the convex section or the driven section is worn out when the voltage value at the time of start up is larger than the specified voltage value.

5 Claims, 4 Drawing Sheets

ULTRASONIC MOTOR, ROBOT, AND LIFE DIAGNOSTIC METHOD OF ULTRASONIC MOTOR

The present application is based on, and claims priority from JP Application Serial Number 2021-204006, filed Dec. 16, 2021, the disclosure of which is hereby incorporated by reference herein in its entirety.

BACKGROUND

1. Technical Field

The present disclosure relates to an ultrasonic motor, a robot, and a life diagnostic method for the ultrasonic motor.

2. Related Art

JP-A-2013-102644 discloses a configuration of an ultrasonic motor provided with a stator functioning as a stator, a rotor functioning as a mover, a preload unit for pressurizing the stator with the rotor, and a vibration unit for generating ultrasonic vibration in the stator and moving the rotor. The stator is provided with a convex section for contact drive of the rotor.

However, in the related art of the ultrasonic motor, since the convex section of the stator repeatedly contacts the rotor while deforming, the convex section of the stator and the rotor are worn down. As a result, there is a problem that pressing force by the convex section is reduced and thrust of the rotor is also reduced. In other words, there is a demand for accurate and simple detection of degree of wear of the convex section and the rotor.

SUMMARY

An ultrasonic motor includes a vibration section having a piezoelectric element configured to generate vibration by receiving a drive voltage, a driven section, a convex section connected to the vibration section and configured to transmit vibration of the vibration section to the driven section, a drive circuit configured to generate the drive voltage, an encoder configured to detect a movement amount of the driven section, a storage section configured to store a specified voltage value, and a determination section configured to receive position information from the encoder when the driven section starts to move and a voltage value from the drive circuit at time of start up and to determine that least one of the convex section or the driven section is worn out when the voltage value at the time of start up is larger than the specified voltage value.

A robot includes the ultrasonic motor described above.

A life diagnostic method of an ultrasonic motor including a vibration section having a piezoelectric element configured to generate vibration by receiving a drive voltage, a driven section, a convex section connected to the vibration section and configured to transmit vibration of the vibration section to the driven section, and an encoder configured to detect a movement amount of the driven section, the life diagnostic method includes receiving position information from the encoder when the driven section starts to move and a voltage value at time of start up and determining that least one of the convex section or the driven section is worn out when the voltage value at the time of start up is larger than a specified voltage value.

DESCRIPTION OF EMBODIMENTS

In the following drawings, the three axes orthogonal to each other will be described as an X-axis, a Y-axis, and a −Z axis. It is assumed that a direction along the X-axis is an "X-direction", a direction along the Y-axis is a "Y-direction", a direction along the Z-axis is a "Z-direction", a direction indicated by an arrow is a +direction, and a direction opposite to the +direction is a −direction. In addition, a +Z-direction may sometimes be referred to as "upper" or "above" a −Z-direction may sometimes be referred to as "lower" or "below", and viewing from the +Z-direction may sometimes be referred to as plan view or planer. In addition, a surface on a +side in the Z-direction will be described as an upper surface, and a surface on a −side in the Z-direction opposite to this will be described as a lower surface.

First, a configuration of a robot 1000 will be described with reference to FIG. 1.

Figure 1:
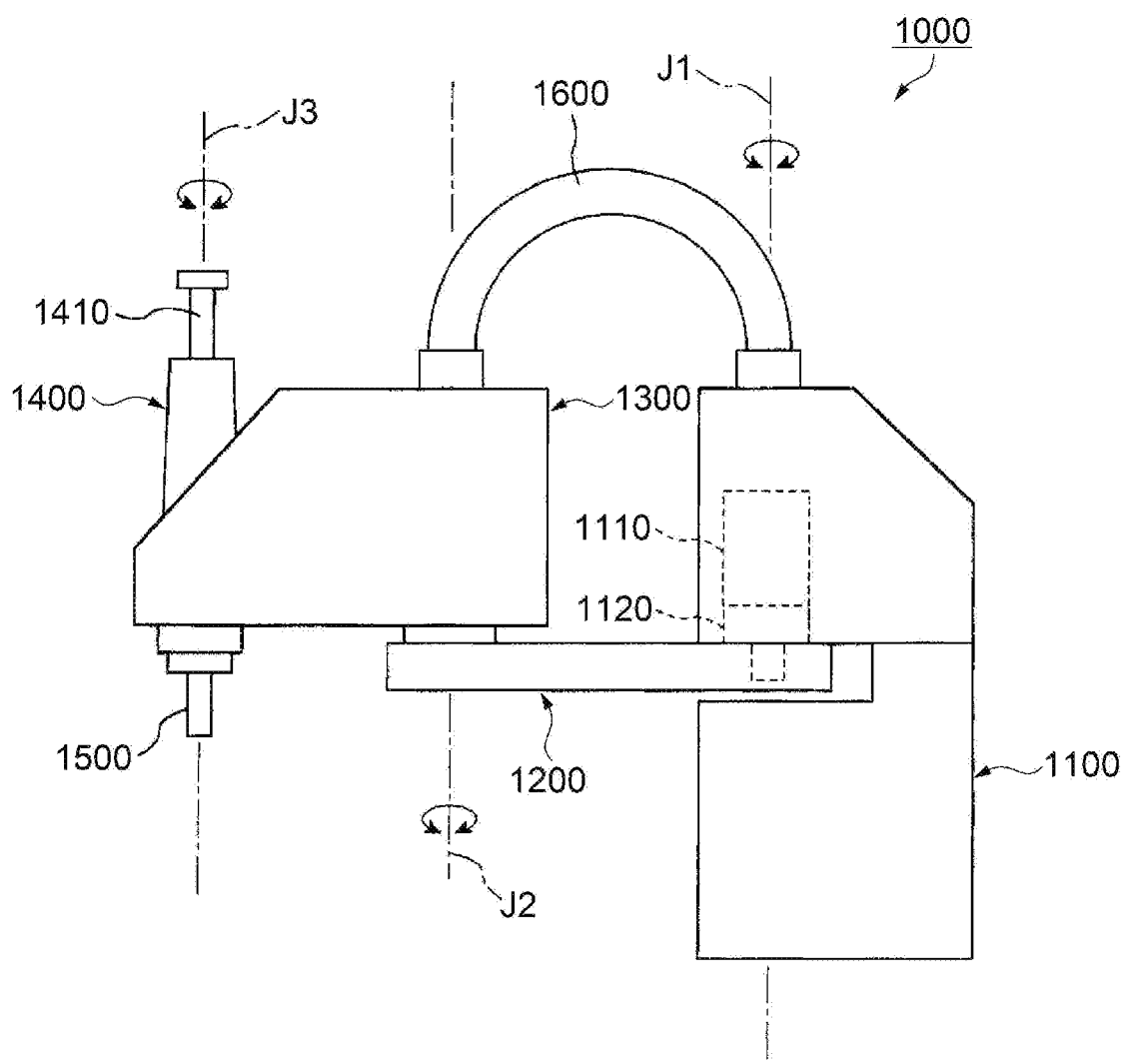
FIG. 1 is a schematic diagram showing configuration of a robot.

A robot 1000 illustrated in FIG. 1 is used, for example, for work such as material feeding, material removal, transport, and assembly of precision equipment or components constituting them. The robot 1000 has a base 1100, a first arm 1200, a second arm 1300, a working head 1400, an end effector 1500, and a pipe 1600.

The base 1100 is fixed to, for example, a floor (not shown) by bolts or the like. A control device (not shown) for generally controlling the robot 1000 is installed inside the base 1100. In addition, the first arm 1200 is coupled to the base 1100 so as to be rotatable around a first axis J1 along the vertical direction with respect to the base 1100. That is, the first arm 1200 rotates relative to the base 1100.

A first motor 1110 (driving source) that generates a driving force for rotating the first arm 1200 and a first decelerator 1120 that reduces the rotation of the driving force of the first motor 1110 are installed inside the base 1100. An input shaft of the first decelerator 1120 is coupled to a rotation shaft of the first motor 1110, and an output shaft of the first decelerator 1120 is coupled to the first arm 1200. Therefore, when the first motor 1110 is driven and the driving force thereof is transmitted to the first arm 1200 via the first decelerator 1120, the first arm 1200 rotates relative to the base 1100 in a horizontal plane around the first axis J1. That is, the first motor 1110 is a driving source that outputs driving force toward the first decelerator 1120.

The second arm 1300, which is rotatable around a second axis J2 with respect to the first arm 1200, is coupled to a tip end section of the first arm 1200. A second motor (not shown) that generates a driving force for rotating the second arm 1300 and a second decelerator (not shown) that reduces the rotation of the driving force of the second motor are installed inside the second arm 1300. Then, when the driving force of the second motor is transmitted to the second arm 1300 via the second decelerator, the second arm 1300 rotates in the horizontal plane around the second axis J2 with respect to the first arm 1200.

A working head 1400 is disposed at a tip end section of the second arm 1300. The working head 1400 has a spline shaft 1410 which is inserted into a spline nut and a ball screw nut (not shown) coaxially disposed at the tip end section of the second arm 1300. The spline shaft 1410 is rotatable around a third axis J3 and movable in the up-down direction with respect to the second arm 1300.

A rotation motor and a vertical movement motor are disposed inside of the second arm 1300, although not shown. A driving force of the rotation motor is transmitted to the spline nut by a driving force transmission mechanism (not shown), and when the spline nut rotates forward and backward, the spline shaft 1410 rotates forward and backward around the third axis J3, which is along the vertical direction.

On the other hand, a driving force of the vertical movement motor is transmitted to the ball screw nut by a driving force transmission mechanism (not shown), and when the ball screw nut rotates forward and backward, the spline shaft 1410 moves up and down.

The end effector 1500 is coupled to a tip end section of the spline shaft 1410. The end effector 1500 is not particularly limited and examples include those that grip an object to be transferred, that process an object to be processed, and the like.

A plurality of wires connected to each electronic component disposed inside of the second arm 1300, for example, the second motor, the rotation motor, the vertical movement motor, and the like are routed to the inside of the base 1100 through the tubular pipe 1600 that connects the second arm 1300 and the base 1100. Further, by concentrating the plurality of wirings inside of the base 1100, the wirings are routed together with wirings connected to the first motor 1110 and an encoder 60 (refer to FIG. 4), to the control device installed inside of the base 1100.

Next, the configuration of an ultrasonic motor 100 applied to a part of the robot 1000 will be described with reference to FIG. 2.

Figure 2:
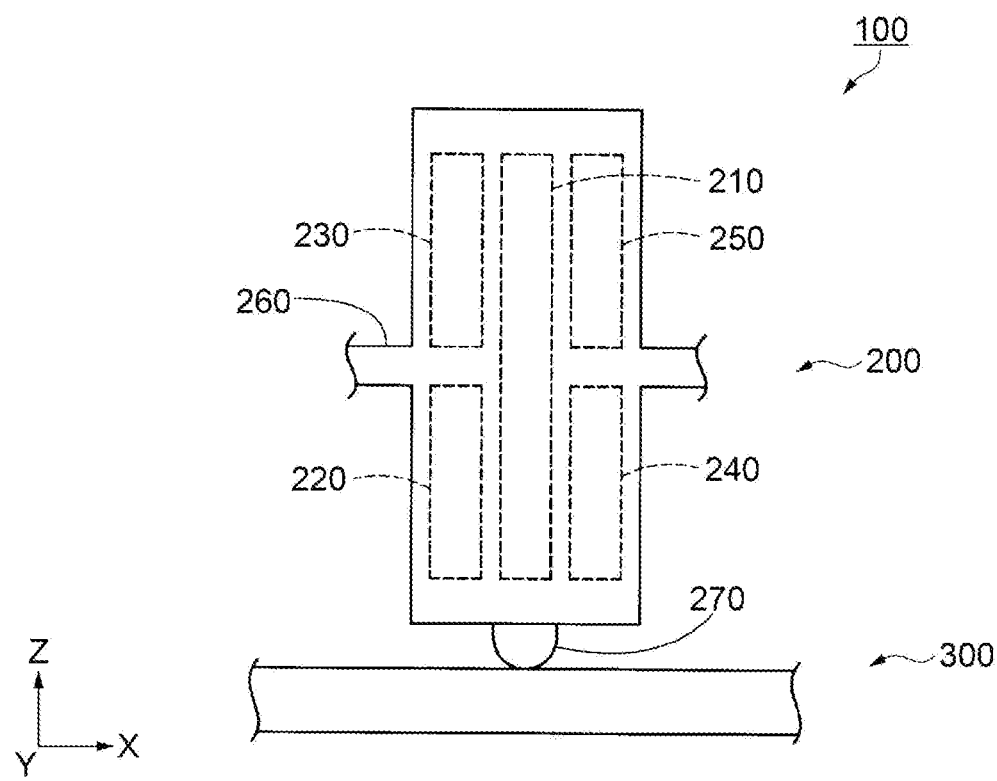
FIG. 2 is a schematic diagram showing configuration of an ultrasonic motor.

As shown in FIG. 2, the ultrasonic motor 100 includes a vibration section 200, a driven section 300 which is contact driven by the vibration section 200, and a convex section 270 which transmits vibration of the vibration section 200 to the driven section 300.

The vibration section 200 includes, for example, a first piezoelectric element 210, a second piezoelectric element 220, a third piezoelectric element 230, a fourth piezoelectric element 240, and a fifth piezoelectric element 250. The piezoelectric elements 210 to 250 generate vibration by receiving a drive voltage, and are disposed along a longitudinal direction of the vibration section 200.

The first piezoelectric element 210 is disposed in a center of the vibration section 200. The second piezoelectric element 220 and the third piezoelectric element 230 are disposed on a left side of the first piezoelectric element 210. The second piezoelectric element 220 is disposed below a support section 260. The third piezoelectric element 230 is disposed above the support section 260.

The fourth piezoelectric element 240 and the fifth piezoelectric element 250 are disposed on a right side of the first piezoelectric element 210. The fourth piezoelectric element 240 is disposed below the support section 260. The fifth piezoelectric element 250 is disposed above the support section 260.

Next, the operation of the vibration section 200 and the driven section 300 constituting the ultrasonic motor 100 will be described with reference to FIG. 3.

Figure 3:
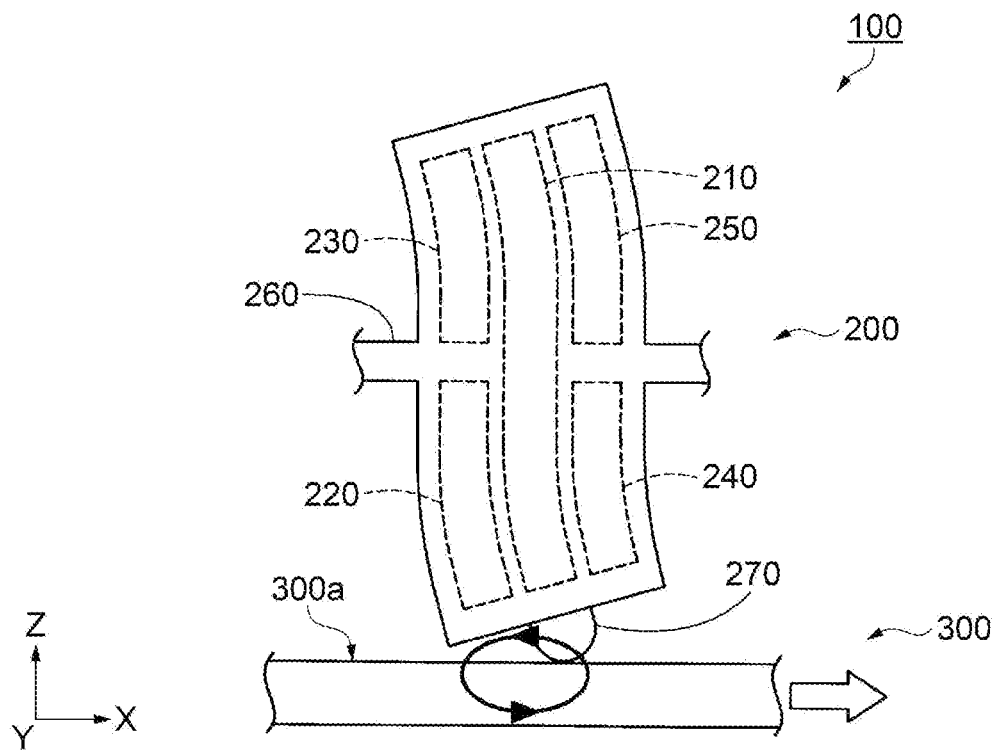
FIG. 3 is a schematic diagram showing operation of a vibration section.

As shown in FIG. 3, by making the phase of the AC voltage supplied to the second piezoelectric element 220 and the fifth piezoelectric element 250 different from the phase of the AC voltage supplied to the third piezoelectric element 230 and the fourth piezoelectric element 240 by 180 degrees, and making the phase of the AC voltage supplied to the first piezoelectric element 210 different from the phase of the AC voltage supplied to the second piezoelectric element 220 and the fifth piezoelectric element 250 by, for example, 90 degrees, the vibration section 200 can be two dimensionally deformed and the convex section 270 can be moved elliptically.

At this time, the vibration section 200 is deformed at the connection portion with the support section 260 as a node. As the convex section 270 repeats the elliptical motion, the convex section 270 and the contact surface 300a of the driven section 300 repeatedly contact each other. While the convex section 270 and the contact surface 300a contact each other, the convex section 270 transmits a driving force along the X-direction to the driven section 300. Therefore, while the convex section 270 repeats the elliptical motion, the driven section 300 moves in the X-direction.

In the present embodiment, since the convex section 270 is biased toward the contact surface 300a while the convex section 270 and the contact surface 300a contact each other, the convex section 270 can efficiently transmit the driving force along the X-direction to the driven section 300. Incidentally, by reversing the AC voltage supplied to the piezoelectric elements 220 to 250 by 180 degrees, the driven section 300 can be moved in the opposite direction.

Note that the driven section 300 is not limited to one that repeats reciprocating motion in the X-direction, and may be, for example, one that performs rotational motion in a circumferential direction along a circular shape if it is a rotor including the circular shape.

Next, the configuration of the ultrasonic motor 100 will be described with reference to FIG. 4.

Figure 4:
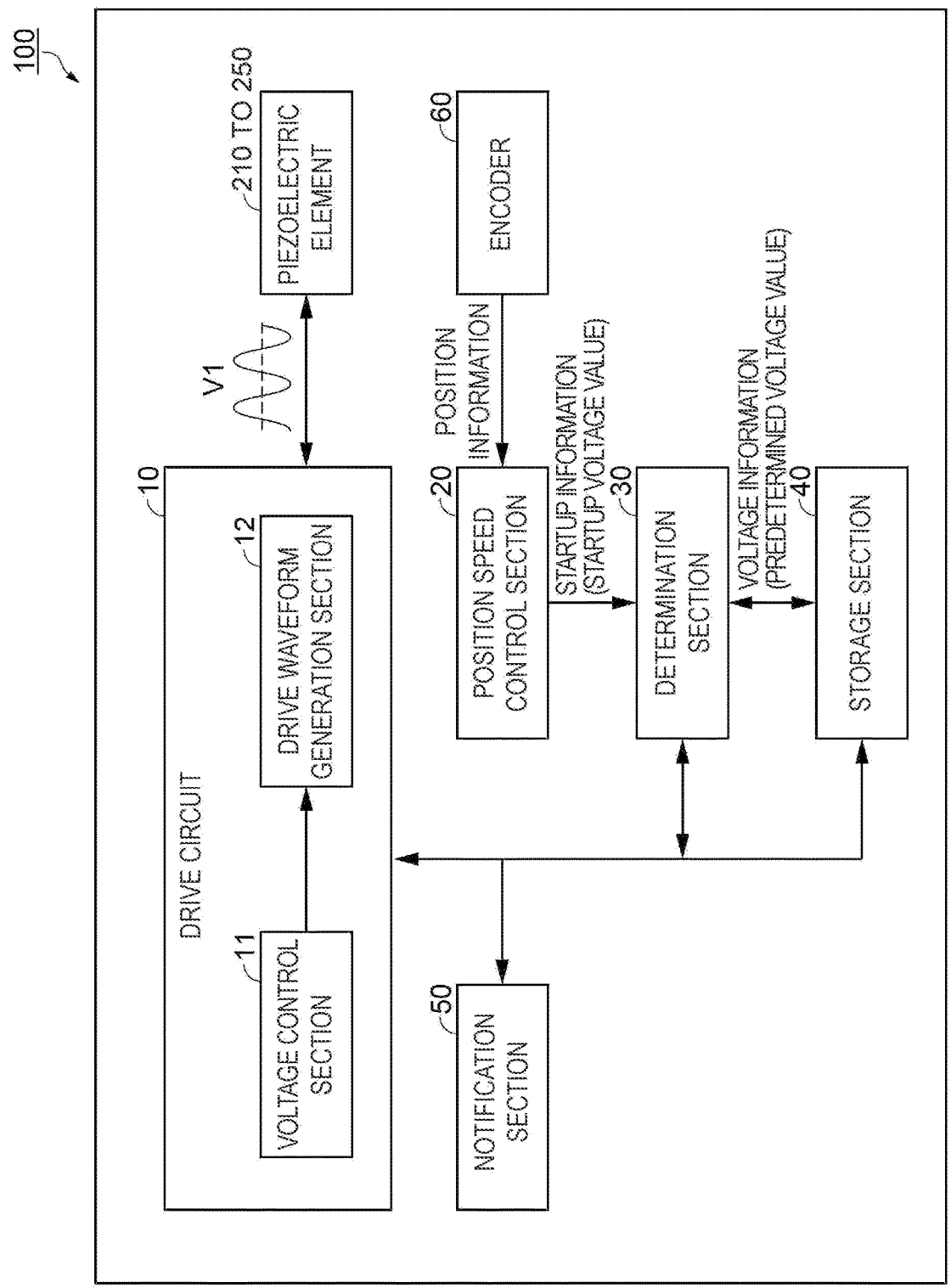
FIG. 4 is a block diagram showing configuration of the ultrasonic motor.

As shown in FIG. 4, the ultrasonic motor 100 includes a drive circuit 10 that drives the piezoelectric elements 210 to 250, a position and speed control section 20, a determination section 30, a storage section 40, a notification section 50, and the encoder 60.

The drive circuit 10 includes a voltage control section 11 and a drive waveform generation section 12. The voltage control section 11 feeds back the voltage information of a drive signal V1, controls the drive voltage, and outputs it to the drive waveform generation section 12. The drive waveform generation section 12 generates, from the input drive voltage, a drive waveform having a frequency based on the resonance frequencies of the piezoelectric elements 210 to 250, and outputs the drive waveform as the drive signal V1.

The position and speed control section 20 converts the amount of mechanical displacement of the driven section 300 into an electric signal, and processes the signal to control the position and speed. In other words, the position and speed control section 20 acquires position information (in other words, the movement amount) of the driven section 300 from the encoder 60, and outputs start up information to the determination section 30.

The determination section 30 compares a specified voltage value with a voltage value at a time of start up when the driven section 300 starts to move, and when the voltage value at the time of start up is larger than the specified voltage value, determines that at least one of the convex section 270 or the driven section 300 is worn out. The specified voltage value is a voltage value when the driven section 300 is initially started up.

The storage section 40 includes a memory such as a random access memory (RAM) and a read only memory (ROM). The RAM is used for temporary storage of various data and the like, and the ROM stores a control program, control data, and the like for controlling the operation of the ultrasonic motor 100. The storage section 40 stores a specified voltage value, an upper limit voltage value of warning, an upper limit voltage value of the drive circuit 10, and the like.

The notification section 50, in response to receiving a signal from the determination section 30, notifies wear information to the user or transmits wear information to a host system. Specifically, the notification section 50 notifies the user by displaying the wear information on a display unit (not shown), or notifies the user with a buzzer or a lamp. By knowing the wear information, the user can repair or replace, for example, the worn out convex section 270 or driven section 300.

Figure 5:
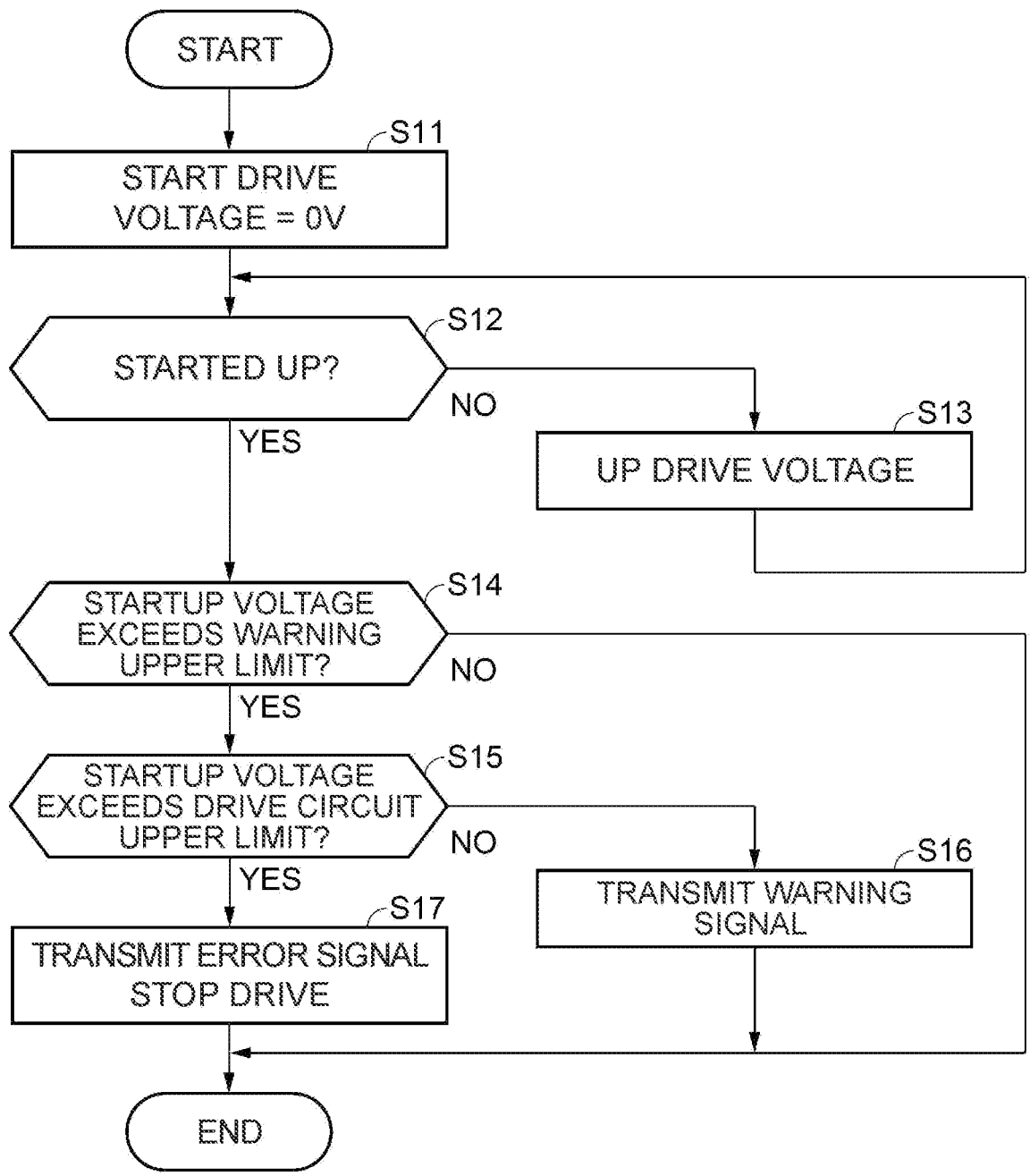
FIG. 5 is a flowchart showing a life diagnostic method of the ultrasonic motor.

Next, a life diagnostic method of the ultrasonic motor 100 will be described with reference to FIG. 5. When the life diagnostic method is performed, for example, when the ultrasonic motor 100 is incorporated in the robot 1000, the inspection is performed without changing the conditions of the robot 1000 (for example, the posture of the robot 1000).

In step S11 the drive circuit 10 starts driving the vibration section 200. The drive voltage at this time is 0 V. Note that a start up voltage value at the initiation of start up is stored in the storage section 40 in advance.

In step S12, the position and speed control section 20 compares whether the driven section 300 has started up (in other words, moved) or not. When the driven section 300 has started up, the process proceeds to step S14. When the driven section 300 has not started up, the process proceeds to step S13.

When the driven section 300 has not started up, then in step S13, the drive circuit 10 increases the drive voltage of the vibration section 200 and repeats the processes of step S12 and step S13 until the driven section 300 starts up.

When the driven section 300 has started up, then in step S14, the determination section 30 compares the start up voltage value stored in the storage section 40 with the current start up voltage value, and determines whether the current start up voltage value has exceeded a warning upper limit that warns that the voltage has approached the maximum voltage that can be output by the drive circuit 10. When it exceeds the warning upper limit, the process proceeds to step S15. When it has not exceeded the warning upper limit, it is determined that there is no problem, and the process ends.

When it exceeds the warning upper limit, then in step S15, the determination section 30 compares whether or not the start up voltage value exceeds an upper limit of the maximum voltage that can be output by the drive circuit 10. When exceeds the upper limit, the process proceeds to step S17, where, because it is assumed that the convex section 270 or the driven section 300 are worn out, the drive of the ultrasonic motor 100 is stopped, or an error signal is transmitted to the host system, and ends this flow. When it has not exceeded the upper limit, the process proceeds to step S16.

When it has not exceeded the upper limit of the drive circuit 10, then in step S16, the determination section 30 transmits a warning signal and ends the process. Specifically, for example, the warning signal is transmitted to the notification section 50 to notify the user that the convex section 270 or the driven section 300 has worn out. In addition, for example, the warning signal is transmitted to the host system to change the driving frequency of the drive circuit 10, thereby changing a vibration condition of the vibration section 200.

As described above, the ultrasonic motor 100 of the present embodiment includes the vibration section 200 having piezoelectric elements 210 to 250 configured to generate vibration by receiving a drive voltage, the driven section 300, the convex section 270 connected to the vibration section 200 and configured to transmit vibration of the vibration section 200 to the driven section 300, the drive circuit 10 configured to generate the drive voltage, the encoder 60 configured to detect the movement amount of the driven section 300, the storage section 40 configured to store a specified voltage value, and the determination section 30 configured to receive position information from the encoder 60 when the driven section 300 starts to move and the voltage value at the time of start up from the drive circuit 10 and to determine that at least one of the convex section 270 or the driven section 300 is worn out when the voltage value at the time of start up is larger than the specified voltage value.

According to this configuration, since the phenomenon of the voltage value at the time of start up increasing in accordance with wear of the convex portion 270 and the driven section 300 is used, it is possible to determine whether or not the convex section 270 and the driven section 300 are worn out by comparing the specified voltage value with the voltage value at the time of start up by the determination section 30. Since the voltage values are compared with each other in this manner, the degree of wear can be detected accurately and easily as compared with a case where another device for measuring wear is newly prepared.

Further, it is desirable that the ultrasonic motor 100 according to the present embodiment further include the notification section 50 configured to receive a signal from the determination section 30 and to notify based, on the received signal.

According to this configuration, for example, the user can repair or replace the convex section 270 and the driven section 300 by being notified by the notification section 50.

Further, it is desirable in the ultrasonic motor 100 according to the present embodiment, the drive circuit 10 is configured to receive a signal from the determination section 30 and to change a drive frequency based on the received signal.

According to this configuration, for example, when the host system receives the signal, it is possible to change the vibration condition of the vibration section 200 such as the drive frequency.

Further, the robot 1000 according to the present embodiment includes the ultrasonic motor 100 described above.

According to this configuration, it is possible to provide the robot 1000 capable of accurately and easily detecting the degree of wear.

Further, the life diagnosis method of the ultrasonic motor 100 according to the present embodiment including the vibration section 200 having piezoelectric elements 210 to 250 configured to generate vibration by receiving the drive voltage, the driven section 300, the convex section 270 connected to the vibration section 200 and configured to transmit vibration of the vibration section 200 to the driven section 300, and the encoder 60 configured to detect a movement amount of the driven section 300, wherein the life diagnostic method of the ultrasonic motor 100 includes receiving position information from the encoder 60 at the time of starting when the driven section 300 starts to move and the voltage value at the time of start up and determining that at least one of the convex section 270 or the driven section 300 is worn out when the voltage value at the time of start up is larger than a specified voltage value.

According to this configuration, since the phenomenon of the voltage value at the time of start up increasing in accordance with wear of the convex portion 270 and the driven section 300 is used, it is possible to determine whether or not the convex section 270 and the driven section 300 are worn out by comparing the specified voltage value with the voltage value at the time of start up. Since the voltage values are compared with each other in this manner, the degree of wear can be detected accurately and easily as compared with a case where another device for measuring wear is newly prepared.

A modification of the above described embodiment will be described below.

As described above, the robot 1000 on which the ultrasonic motor 100 is mounted is not limited to a horizontal articulated robot as described above, and may be a vertical articulated robot having six axes.

What is claimed is:

1. An ultrasonic motor comprising:
   a vibration section having a piezoelectric element configured to generate vibration by receiving a drive voltage;
   a driven section;
   a convex section connected to the vibration section and configured to transmit vibration of the vibration section to the driven section;
   a drive circuit configured to generate the drive voltage;
   an encoder configured to detect a movement amount of the driven section;
   a storage section configured to store a specified voltage value; and
   a determination section configured to receive position information from the encoder when the driven section starts to move and a voltage value from the drive circuit at time of start up and to determine that least one of the convex section or the driven section is worn out when the voltage value at the time of start up is larger than the specified voltage value.

2. The ultrasonic motor according to claim 1, further comprising:
   a notification section configured to receive a signal from the determination section and to notify based on the received signal.

3. The ultrasonic motor according to claim 1, wherein the drive circuit is configured to receive a signal from the determination section and to change a drive frequency based on the received signal.

4. A robot comprising:
   the ultrasonic motor according to claim 1.

5. A life diagnostic method of an ultrasonic motor including
   a vibration section having a piezoelectric element configured to generate vibration by receiving a drive voltage;
   a driven section;
   a convex section connected to the vibration section and configured to transmit vibration of the vibration section to the driven section; and
   an encoder configured to detect a movement amount of the driven section,
   the life diagnostic method comprising:
   receiving position information from the encoder when the driven section starts to move and a voltage value at time of start up and determining that least one of the convex section or the driven section is worn out when the voltage value at the time of start up is larger than a specified voltage value.

* * * * *